(12) United States Patent
Yeh et al.

(10) Patent No.: US 8,324,743 B2
(45) Date of Patent: Dec. 4, 2012

(54) SEMICONDUCTOR DEVICE WITH A STRUCTURE TO PROTECT ALIGNMENT MARKS FROM DAMAGE IN A PLANARIZATION PROCESS

(75) Inventors: Chiao-Wen Yeh, Rueifang Township, Taipei County (TW); Chih-Hao Huang, Jhubei (TW)

(73) Assignee: Macronix International Co., Ltd., Hsin-Chu (TW)

( * ) Notice: Subject to any disclaimer, the term of this patent is extended or adjusted under 35 U.S.C. 154(b) by 14 days.

(21) Appl. No.: 12/814,228

(22) Filed: Jun. 11, 2010

(65) Prior Publication Data
US 2011/0304006 A1 Dec. 15, 2011

(51) Int. Cl.
*H01L 21/76* (2006.01)
(52) U.S. Cl. .................. 257/797; 257/E23.179
(58) Field of Classification Search .................. None
See application file for complete search history.

(56) References Cited

U.S. PATENT DOCUMENTS

| | | |
|---|---|---|
| 5,783,490 A | 7/1998 | Tseng |
| 6,218,262 B1 * | 4/2001 | Kuroi et al. .................. 438/401 |
| 2002/0005594 A1 * | 1/2002 | Iwamatsu .................. 257/797 |
| 2004/0198017 A1 * | 10/2004 | Chang et al. .................. 438/401 |
| 2005/0101107 A1 * | 5/2005 | Ohto et al. .................. 438/462 |
| 2009/0146325 A1 * | 6/2009 | Liu et al. .................. 257/797 |

FOREIGN PATENT DOCUMENTS

CN 101452912 A 6/2009

OTHER PUBLICATIONS

Office Action from Chinese Patent Application No. 201010198798.7 dated Jul. 20, 2012.

* cited by examiner

*Primary Examiner* — Victor A Mandala
*Assistant Examiner* — Selim Ahmed
(74) *Attorney, Agent, or Firm* — Alston & Bird LLP

(57) ABSTRACT

A method of protecting alignment marks from damage in a planarization process includes providing a substrate including a surface, forming trenches in the substrate from the surface, forming a first dielectric layer on the substrate, forming a second dielectric layer on the first dielectric layer, forming a patterned second dielectric layer by removing second dielectric over the trenches, resulting in openings defined by the trenches and the patterned second dielectric layer, forming a third dielectric layer on the patterned second dielectric layer, the third dielectric layer filling the openings, and planarizing the third dielectric layer by using the patterned second dielectric layer as a stop layer, resulting in residual third dielectric in the openings that includes a first portion in the substrate and a second portion above the surface of the substrate.

4 Claims, 8 Drawing Sheets

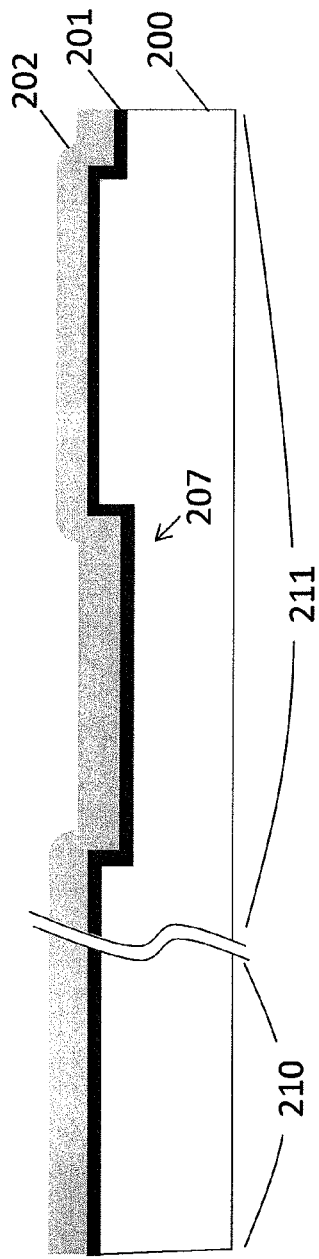
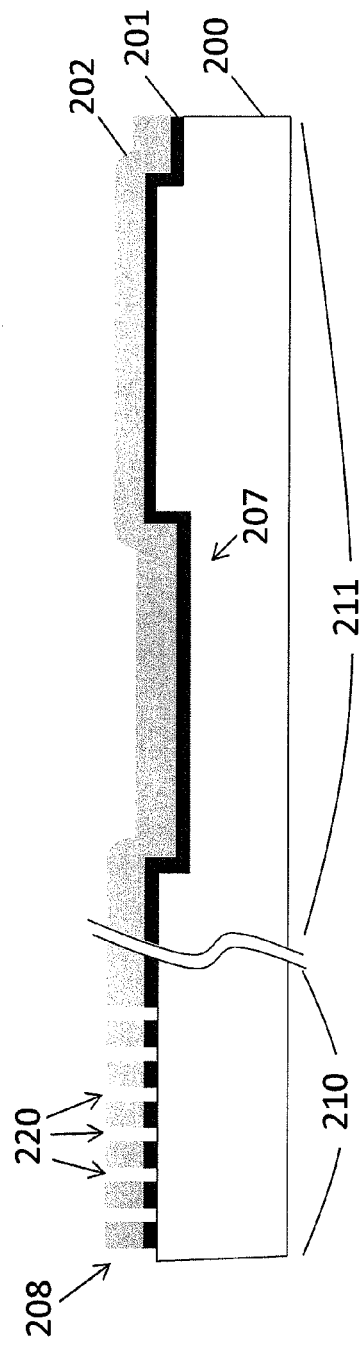

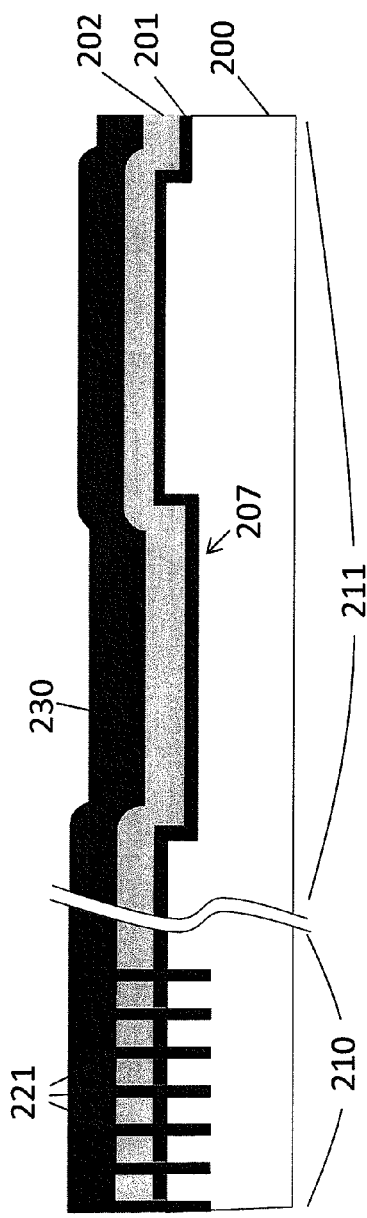
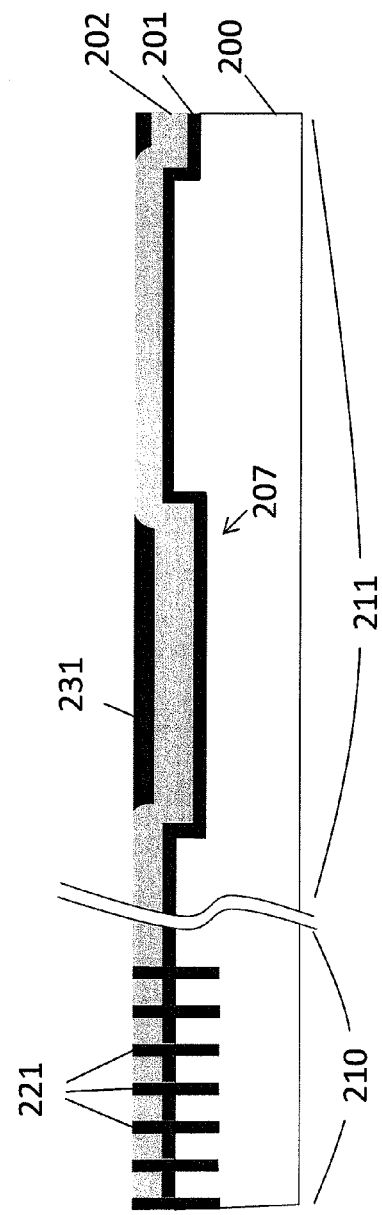
Fig. 2c (PRIOR ART)
Fig. 2d (PRIOR ART)

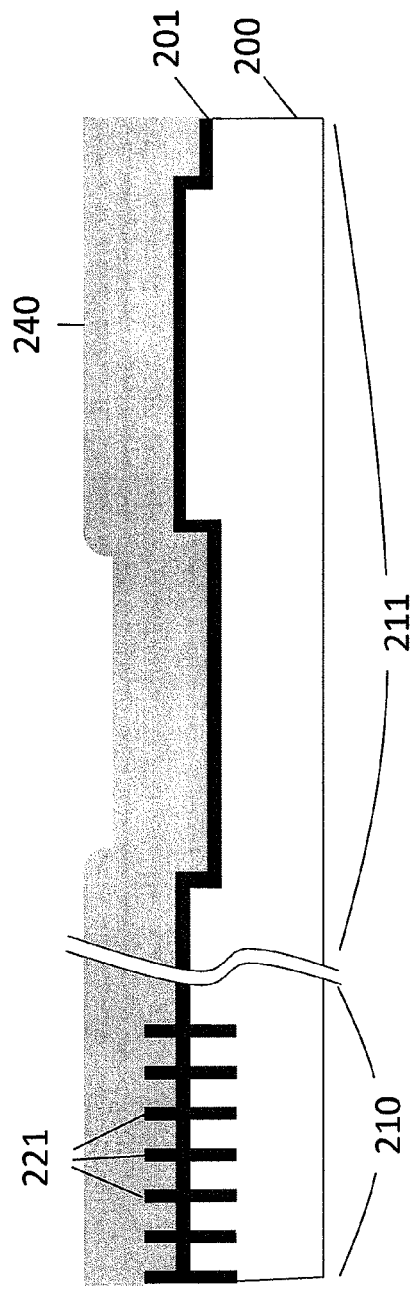
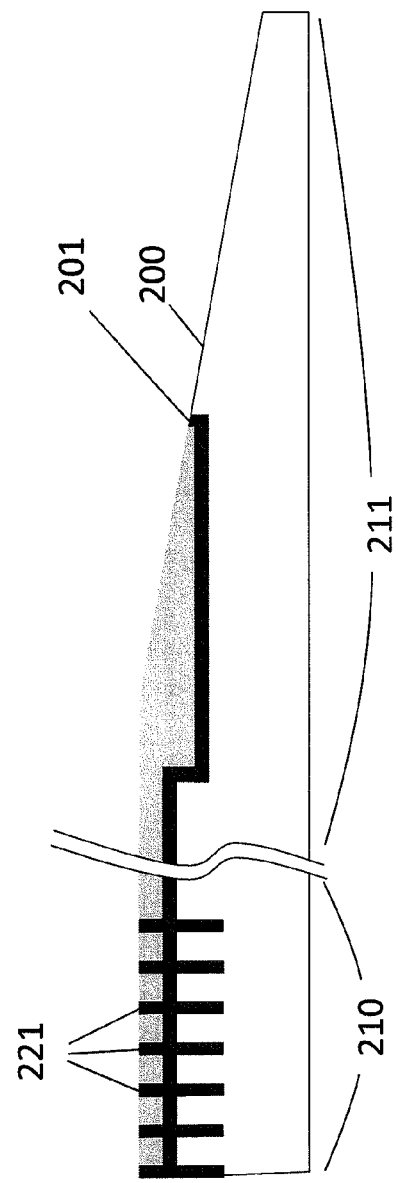

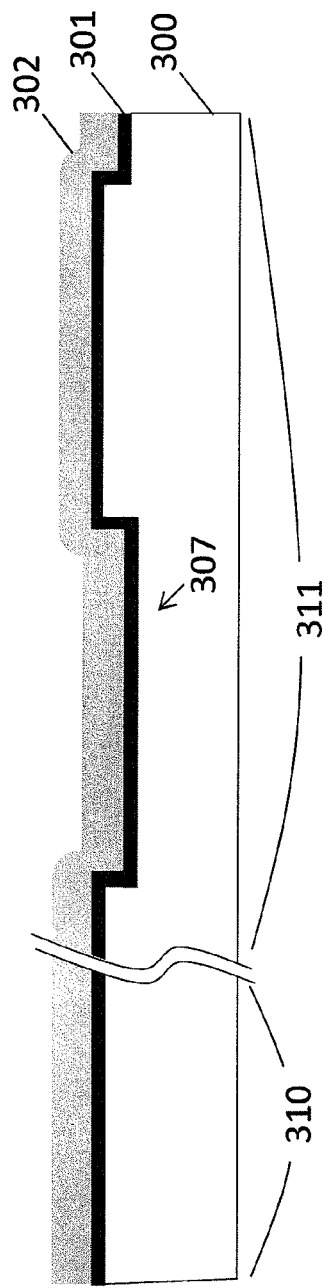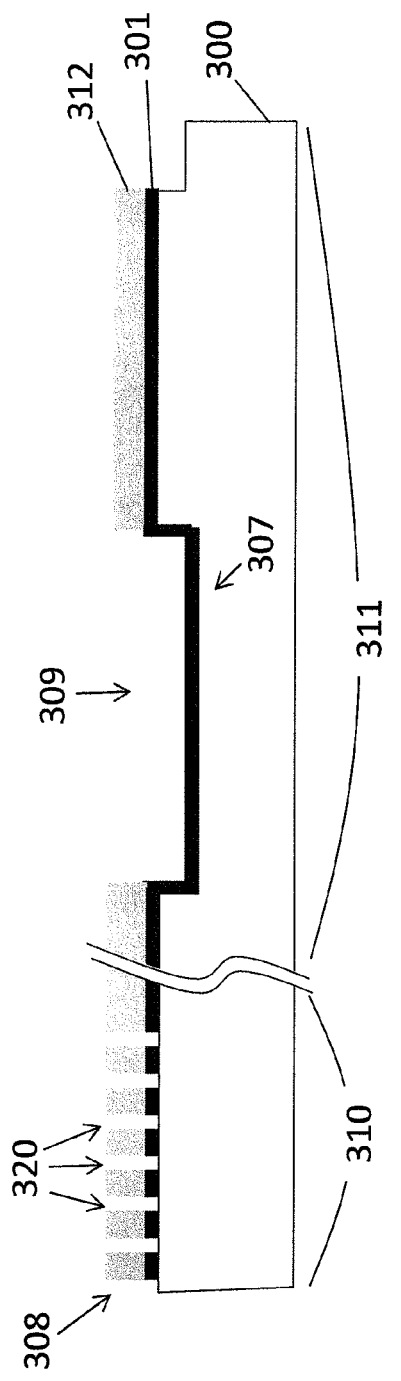
Fig. 3a
Fig. 3b

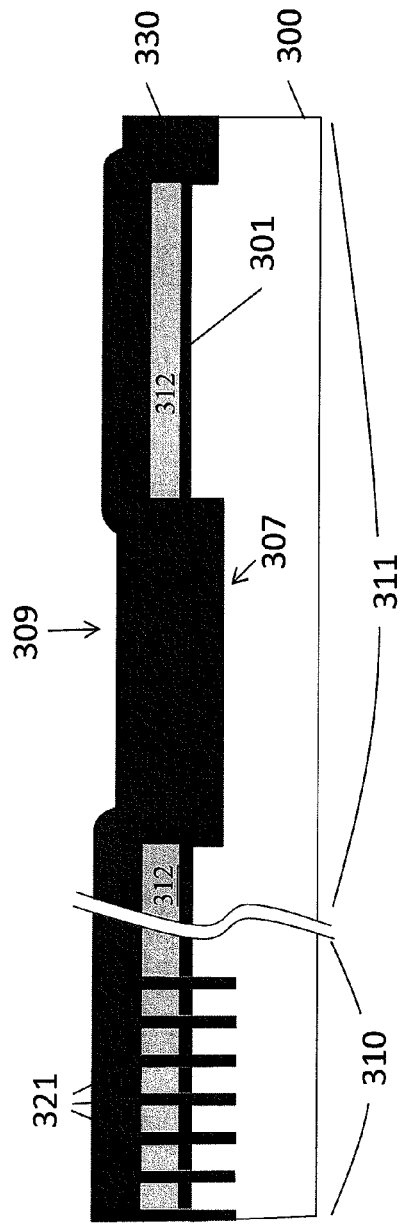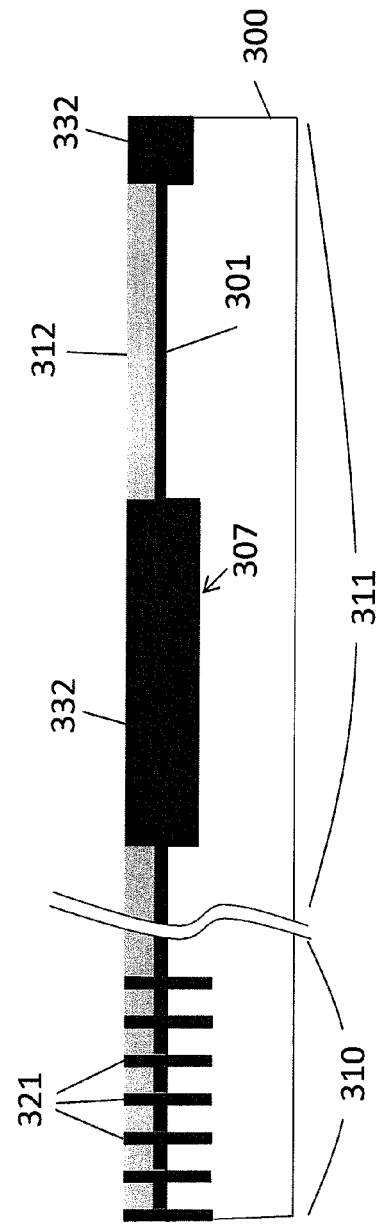
Fig. 3c
Fig. 3d

SEMICONDUCTOR DEVICE WITH A STRUCTURE TO PROTECT ALIGNMENT MARKS FROM DAMAGE IN A PLANARIZATION PROCESS

BACKGROUND OF THE INVENTION

The present invention generally relates to semiconductor manufacturing and, more particularly, to a method of protecting alignment marks from damage in a planarization process and a semiconductor device formed by the method.

One of the important aspects of fabricating integrated circuits (ICs) is to align layers in respect of one another in manufacturing of semiconductor components. That is, each layer may be precisely aligned so that the circuits formed therein match the design and thus work properly. However, as the dimension of the semiconductor device shrinks, the accuracy of aligning each layer becomes critical.

A tool known as a stepper is typically collaborated to align one layer with respect to another. A circuit pattern is projected optically from a photomask or reticle mounted in the stepper onto a layer formed on the semiconductor wafer with the help of the stepper. It is generally necessary to position or align the wafer being patterned in relation to the photomask. By using alignment marks defined on the wafer in previous processes, the alignment can be accomplished and the subsequent steps such as projecting the pattern onto the semiconductor wafer may proceed.

FIG. 1 is a schematic plan view which illustrates alignment mark areas 11 in a substrate 10. The substrate 10 may be overlaid by active areas 13, alignment mark areas 11 and a plurality of alignment mark trenches 12. The alignment mark trenches 12 may be arranged in an optional cross pattern and formed in the alignment mark areas 11. Furthermore, an alignment mark flattop 14 may be defined between adjacent alignment mark trenches 12.

When more layers are formed on the wafer, to planarize the wafer topography at intermediate processes, a global planarization technique, such as chemical and mechanical polish (CMP) may be used, which involves chemical etching and/or mechanical grinding/polishing a surface. The CMP or other planarization process, however, may damage the alignment marks on a wafer, resulting in a loading effect, as will be discussed in FIGS. 2a to 2f below.

Referring to FIG. 2a, a substrate 200, which may be p-type or n-type, may be provided. The substrate 200 may be further divided to an active area 210 on which electronic device features are formed and predefined alignment mark areas 211 with alignment mark trenches 207, which may be formed by plasma etching with a desired depth that may be determined by a function of the alignment radiation wavelength, e.g., 214.

A thin oxide layer 201 may then be grown on the substrate 200. Next, a silicon nitride ($Si_3N_4$) layer 202 may be formed on the oxide layer 201.

Referring to FIG. 2b, by photolithographic patterning and etching, a patterned silicon nitride layer 208 may be formed at the active area 210 so as to define shallow trench isolation (STI) regions 220.

Referring to FIG. 2c, an oxide layer 230 may be deposited on the silicon nitride layers 202 and 208, filling the STI regions 220, resulting in STI features 221.

Referring to FIG. 2d, the oxide layer 230 except those 231 on the alignment mark trenches 207 may be removed by an etching process followed by a planarization process. The planarization may include a residue removal process such as a CMP process, which may be accomplished by polishing the surface of a wafer by a polishing pad wetted with slurry mixed by basic solvent, abrasive and suspension fluid. The CMP process may be conducted until reaching a stop layer, for example, silicon nitride layer 202.

Referring to FIG. 2e, the residual oxide 231 and the silicon nitride layer 202 may then be removed. Next, a polysilicon layer 240 may be deposited.

Referring to FIG. 2f, when another planarization process such as CMP is conducted using the STI oxide 221 as the stop layer, the loading effect that may damage the alignment marks may occur because oxide 221 is considerably more rigid than polysilicon 240.

BRIEF SUMMARY OF THE INVENTION

Examples of the present invention may provide a method of protecting alignment marks from damage in a planarization process. The method comprises providing a substrate including a first area and a second area, forming trenches in the substrate from a surface thereof at the second area, forming a first dielectric layer on the substrate, forming a second dielectric layer on the first dielectric layer, forming a patterned second dielectric layer by removing portions of first and second dielectrics to expose portions of substrate at the first area and removing second dielectric over the trenches at the second area, resulting in openings defined by the trenches and the patterned second dielectric layer at the second area, etching the substrate through the exposed portions, forming a third dielectric layer on the patterned second dielectric layer, and planarizing the third dielectric layer by using the patterned second dielectric layer as a stop layer, resulting in isolation features at the first area and residual third dielectric in the openings at the second area, wherein the residual third dielectric includes a first portion in the substrate and a second portion above the surface of the substrate.

Examples of the present invention may also provide a method of protecting alignment marks from damage in a planarization process. The method comprises providing a substrate including a surface, forming trenches in the substrate from the surface, forming a first dielectric layer on the substrate, forming a second dielectric layer on the first dielectric layer, forming a patterned second dielectric layer by removing second dielectric over the trenches, resulting in openings defined by the trenches and the patterned second dielectric layer, forming a third dielectric layer on the patterned second dielectric layer, the third dielectric layer filling the openings, and planarizing the third dielectric layer by using the patterned second dielectric layer as a stop layer, resulting in residual third dielectric in the openings that includes a first portion in the substrate and a second portion above the surface of the substrate.

Some examples of the present invention may provide a semiconductor device having a structure to protect alignment marks from damage in a planarization process. The semiconductor device comprises a substrate including a surface and a first area and a second area, the first area and the second area being spaced apart from one another, a plurality of isolation features at the first area, and a plurality of alignment marks at the second area, wherein each of the alignment marks includes a first portion in the substrate and a second portion above the surface of the substrate.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIGS. 2a to 2f are cross-sectional views illustrating a method of semiconductor manufacturing in prior art, where alignments marks are damaged by a planarization process; and FIGS. 3a to 3g are cross-sectional views illustrating a method of protecting alignment marks in accordance with an example of the present invention.

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 1:
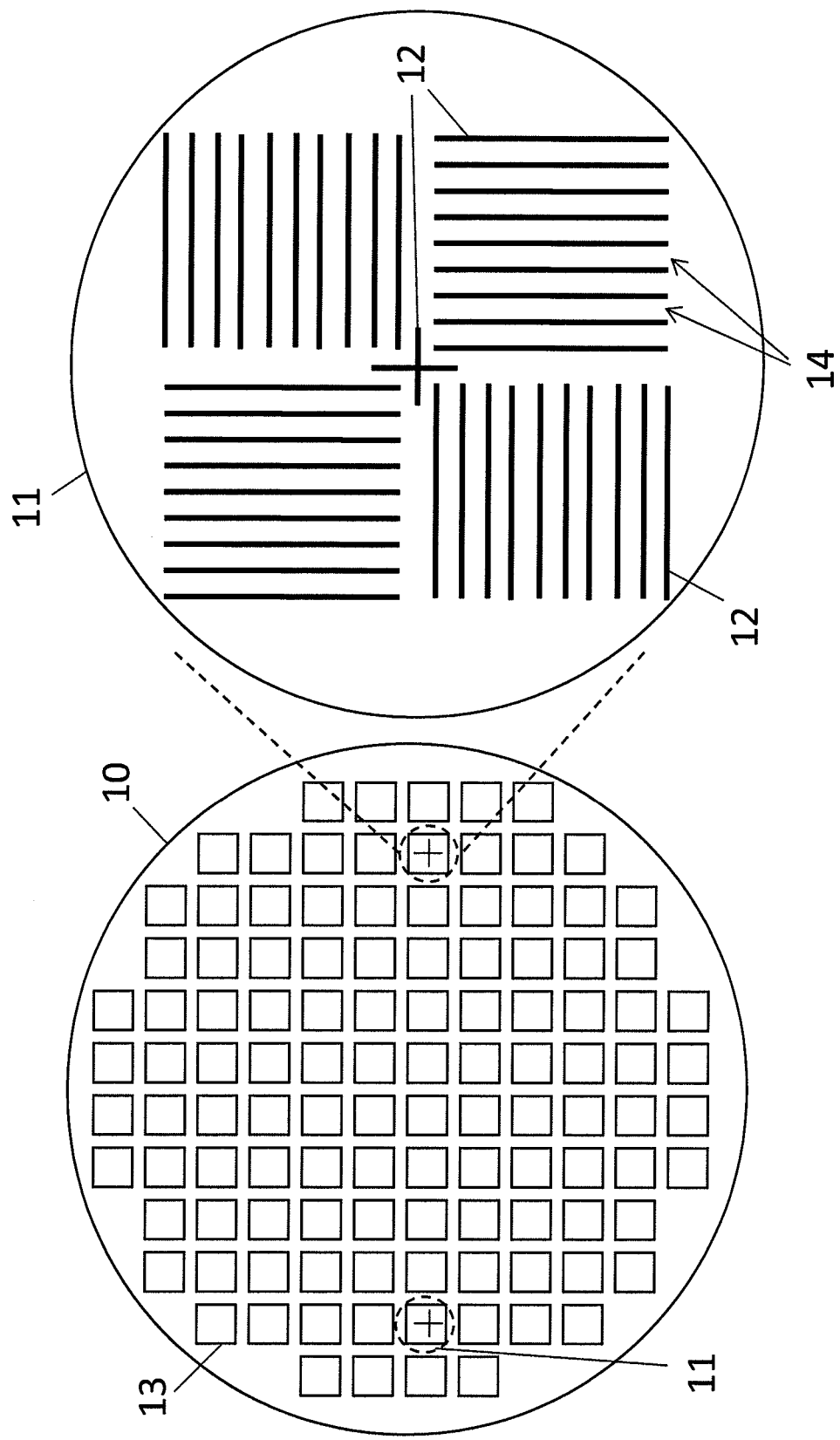
FIG. 1 is a schematic plan view which illustrates alignment mark areas in a substrate.
Figure 3E:
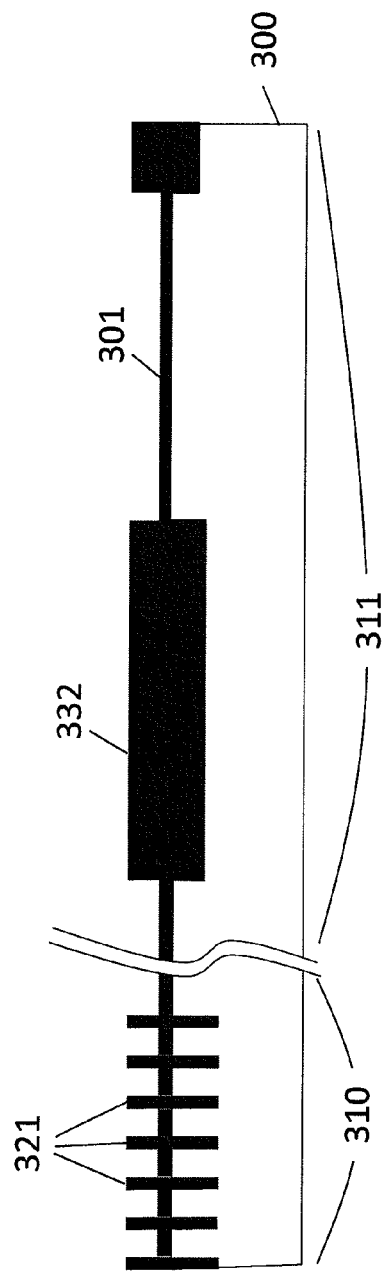

FIGS. 3a to 3g are cross-sectional views illustrating a method of protecting alignment marks in accordance with an example of the present invention. Referring to FIG. 3a, a substrate 300, either p-type or n-type, may be provided. The substrate 300 may include a first area 310 on which device features are to be formed and one or more second area 311 provided with alignment mark trenches 307. The first area 310 and the one or more second area 311 may be spaced apart from each other. Furthermore, the alignment mark trenches 307 may be formed by a patterning and etching process or other suitable process and each of the trenches 307 may have a depth of approximately 1200 angstrom (Å), given a 75-nm (nanometer) flash memory process.

A first dielectric layer 301 may then be formed on the substrate 300 by, for example, a thermal oxidation process. In one example, the first dielectric layer 301 may include silicon oxide such as silicon dioxide ($SiO_2$) or silicon oxynitride (SiON). Furthermore, the thickness of the first dielectric layer 301 may range from approximately 50 to 150 Å, given the 75-nm process.

Next, a second dielectric layer 302 may be formed on the first dielectric layer 301 by a deposition process. In one example, the second dielectric layer 302 may include silicon nitride ($Si_3N_4$) and have a thickness ranging from approximately 1400 to 1800 Å.

Referring to FIG. 3b, by a photolithographic patterning and etching process, a patterned second dielectric layer 312 may be formed. The patterned second dielectric layer 312 may include a patterned region 308 at the first area 310, exposing portions 320 of the substrate 300. Moreover, the second dielectric layer 302 over the alignment mark trenches 307 may be removed during the etching process, exposing the first dielectric layer 301 associated with the alignment mark trenches 307. An opening 309 may thus be defined by the patterned second dielectric layer 312 and each of the alignment mark trenches 307 at the second area 311.

Next, the substrate 300 may be etched through the exposed portions 320 so as to facilitate the formation of shallow trench isolation (STI) features.

Referring to FIG. 3c, a third dielectric layer 330 may be formed on the patterned second dielectric layer 312, resulting in STI features 321 at the first area 310. In one example according to the present invention, the third dielectric layer 330 may include silicon oxide or silicon oxynitride and may have a thickness ranging from approximately 3000 to 4000 Å.

Referring to FIG. 3d, the third dielectric layer 330 except third dielectric 332 in the openings 309 may be removed by a first planarization process such as a chemical mechanical polishing (CMP) process, using the patterned second dielectric layer 312 as a stop layer.

Referring to FIG. 3e, the patterned second dielectric layer 312 in FIG. 3d may be removed. The residual third dielectric 332 may consequently serve as alignment marks.

Figure 3F:
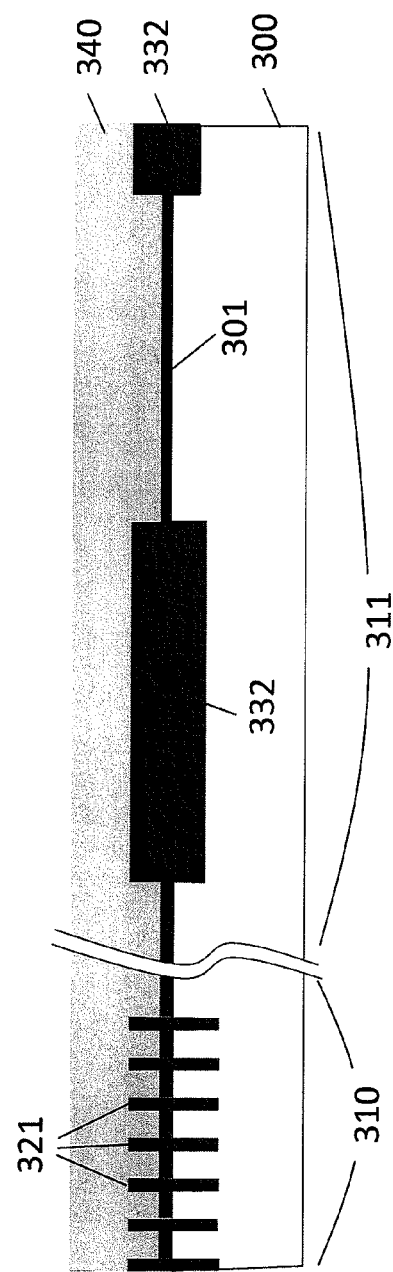

Next, referring to FIG. 3f, a conductive layer 340 such as a polysilicon layer may be formed on the first dielectric layer 301, the STI features 321 and the residual third dielectric 332 by, for example, a deposition process. In one example, the conductive layer 340 may have a thickness ranging from approximately 3000 to 4000 Å.

Figure 3G:
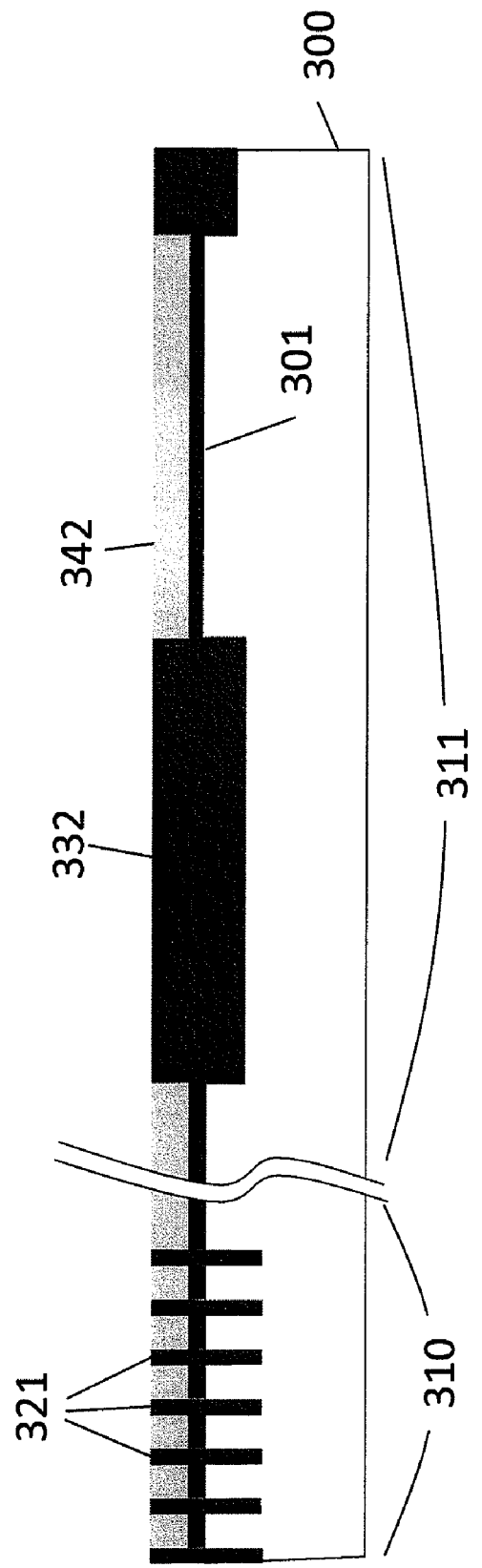

Referring to FIG. 3g, a patterned conductive layer 342 may be formed by a second planarization process such as a CMP process, using at least one of the STI features 321 or the residual third dielectric 332 as a stop layer. The residual third dielectric 332, the STI features 321 and the patterned conductive layer 342 may be flush with one another over the substrate 300 after the second planarization process. Furthermore, the residual third dielectric 332 may include a first portion 3321 in the substrate 300 and a second portion 3322 over the substrate 300.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:
1. A semiconductor device comprising:
a substrate including a surface and a first area and a second area, the first area and the second area being spaced apart from one another;
a plurality of isolation features at the first area;
a plurality of alignment marks at the second area; and a patterned conductive layer flush with the alignment marks and isolation features over the substrate,
wherein each of the alignment marks includes a first portion in the substrate and a second portion above the surface of the substrate.

2. The semiconductor device of claim 1, wherein the second portion of each of the alignment marks and the isolation features are flush with one another.

3. The semiconductor device of claim 1, wherein the alignment marks include one of silicon oxide and silicon oxynitride.

4. The semiconductor device of claim 1, wherein the isolation features include one of silicon oxide and silicon oxynitride.

* * * * *

UNITED STATES PATENT AND TRADEMARK OFFICE
CERTIFICATE OF CORRECTION

PATENT NO. : 8,324,743 B2  Page 1 of 1
APPLICATION NO. : 12/814228
DATED : December 4, 2012
INVENTOR(S) : Yeh et al.

It is certified that error appears in the above-identified patent and that said Letters Patent is hereby corrected as shown below:

In the Specifications:

Column 1,
Line 51, "214" should read --$\lambda/4$--.

Signed and Sealed this
Fourteenth Day of May, 2013

Teresa Stanek Rea
*Acting Director of the United States Patent and Trademark Office*